(12) United States Patent
Cho et al.

(10) Patent No.: US 10,742,182 B2
(45) Date of Patent: Aug. 11, 2020

(54) AMPLIFIER, AND RECEIVING CIRCUIT, SEMICONDUCTOR APPARATUS, AND SYSTEM USING THE AMPLIFIER

(71) Applicant: SK hynix Inc., Icheon-si Gyeonggi-do OT (KR)

(72) Inventors: Sun Ki Cho, Suwon-si (KR); Dae Han Kwon, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 3 days.

(21) Appl. No.: 16/209,650

(22) Filed: Dec. 4, 2018

(65) Prior Publication Data
US 2019/0356289 A1    Nov. 21, 2019

(30) Foreign Application Priority Data
May 15, 2018    (KR) .......................... 10-2018-0055467

(51) Int. Cl.
*H03F 3/72* (2006.01)
*H03F 3/45* (2006.01)
*H04L 25/02* (2006.01)

(52) U.S. Cl.
CPC ........... *H03F 3/45183* (2013.01); *H03F 3/72* (2013.01); *H04L 25/0292* (2013.01); *H03F 2203/7236* (2013.01); *H04L 25/0272* (2013.01)

(58) Field of Classification Search
CPC ........... H03F 3/45; H03F 3/72; H04L 25/0292
USPC ............................... 330/253, 254, 51; 326/30
See application file for complete search history.

(56) References Cited

U.S. PATENT DOCUMENTS

| | | | |
|---|---|---|---|
| 4,267,516 A * | 5/1981 | Traa | H03F 3/45103 330/149 |
| 8,432,185 B2 | 4/2013 | Scott et al. | |
| 2013/0257513 A1* | 10/2013 | Sanchez | H03F 3/72 327/404 |

\* cited by examiner

*Primary Examiner* — Steven J Mottola
(74) *Attorney, Agent, or Firm* — William Park & Associates Ltd.

(57) ABSTRACT

A receiving circuit may include an amplifier. The amplifier may include a first amplification circuit and a second amplification circuit. The first amplification circuit may be configured to differentially amplify a first input signal and a reference signal and configured to generate output signals. The second amplification circuit may be configured to differentially amplify a second input signal and the reference signal and configured to generate the output signals.

27 Claims, 7 Drawing Sheets

FIG.4
340
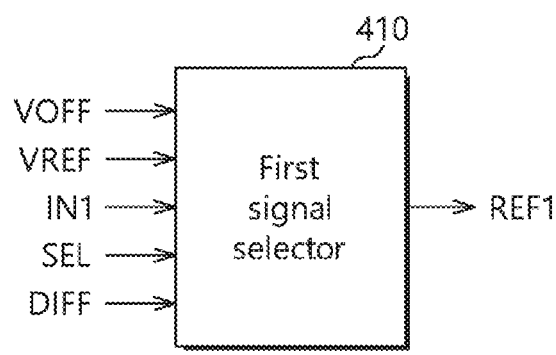
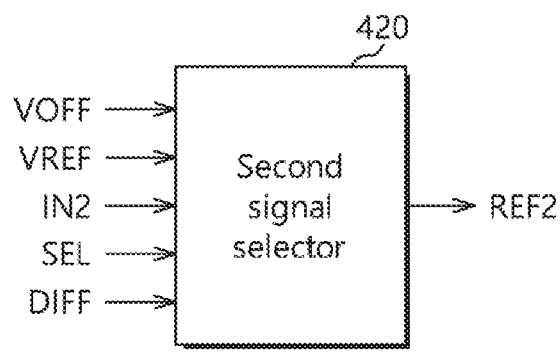

AMPLIFIER, AND RECEIVING CIRCUIT, SEMICONDUCTOR APPARATUS, AND SYSTEM USING THE AMPLIFIER

CROSS-REFERENCES TO RELATED APPLICATION

The present application claims priority under 35 U.S.C. § 119(a) to Korean application number 10-2018-0055467, filed on May 15, 2018, in the Korean Intellectual Property Office, which is incorporated herein by reference in its entirety.

BACKGROUND

1. Technical Field

Various embodiments generally relate to an integrated circuit technology and, more particularly, to a semiconductor apparatus and a semiconductor system.

2. Related Art

Electronic apparatuses may each include a large number of electronic components. Among the electronic apparatuses, a computer system may include a large number of semiconductor apparatuses which are constructed by semiconductors. The semiconductor apparatuses which construct the computer system may communicate with one another by transmitting or receiving a clock and data. Each of the semiconductor apparatuses may include a receiving circuit to receive a signal transmitted from an external apparatus or receive a signal between internal circuits in the semiconductor apparatus. The receiving circuit may generally include an amplifier which performs a differential amplifying operation and receives a pair of differential signals or a single-ended signal. The amplifier may receive signals by differentially amplifying differential signals or may receive signals by differentially amplifying a single-ended signal and a reference voltage.

As the operating speed of the computer system increases, the speed of the clock signal continues to increase, and also, the semiconductor apparatuses which configure the system are designed to operate at a higher frequency. In receiving circuits, the design of an amplifier may be variously changed depending on the frequency of the clock signal. General types of amplifiers include a CML (current mode logic) amplifier and a CMOS amplifier. The CML amplifier is advantageous in terms of high speed operation since it outputs a signal which does not fully swing. Conversely, the CMOS amplifier has a characteristic that it can perform a precise amplifying operation but is disadvantageous in terms of high speed operation since it outputs a signal which fully swings.

SUMMARY

In an embodiment, a receiving circuit may include an amplifier. The amplifier may include a first amplification circuit, a second amplification circuit, a first enable circuit, and a second enable circuit. The first amplification circuit may be configured to differentially amplify an input signal and a reference voltage and configured to generate output signals. The second amplification circuit may be configured to differentially amplify a complementary input signal and the reference voltage and configured to generate the output signals. The first enable circuit may be configured to activate the first amplification circuit based on a first enable signal. The second enable circuit may be configured to activate the second amplification circuit based on a second enable signal.

In an embodiment, a receiving circuit may include an amplifier. The amplifier may include a first amplification circuit, a second amplification circuit, and an amplification control circuit. The first amplification circuit may be coupled between a first common node and first and second output nodes and configured to change voltage levels of the first and second output nodes based on a first input signal and a reference signal. The second amplification circuit may be coupled between a second common node and the first and second output nodes and configured to change voltage levels of the first and second output nodes based on a second input signal and the reference signal. The amplification control circuit may be configured to couple the first common node and the second common node based on an amplification mode.

In an embodiment, a receiving circuit may include an amplifier and a reference signal control circuit. The amplifier may include a first amplification circuit and a second amplification circuit. The first amplification circuit may be coupled between a first common node and first and second output nodes and configured to change voltage levels of the first and second output nodes based on a first input signal and a reference signal. The second amplification circuit may be coupled between a second common node and the first and second output nodes and configured to change the voltage levels of the first and second output nodes based on a second input signal and the reference signal. The reference signal control circuit may generate the reference signal which has different characteristics, based on an amplification mode signal and a receiving select signal.

BRIEF DESCRIPTION OF THE DRAWINGS

FIG. 4 is a diagram illustrating a configuration of the reference signal control circuit illustrated in FIG. 3.

DETAILED DESCRIPTION

Hereinafter, an amplifier, and a receiving circuit, a semiconductor apparatus, and a semiconductor system using the amplifier will be described below with reference to the accompanying drawings through various examples of embodiments.

Figure 1:
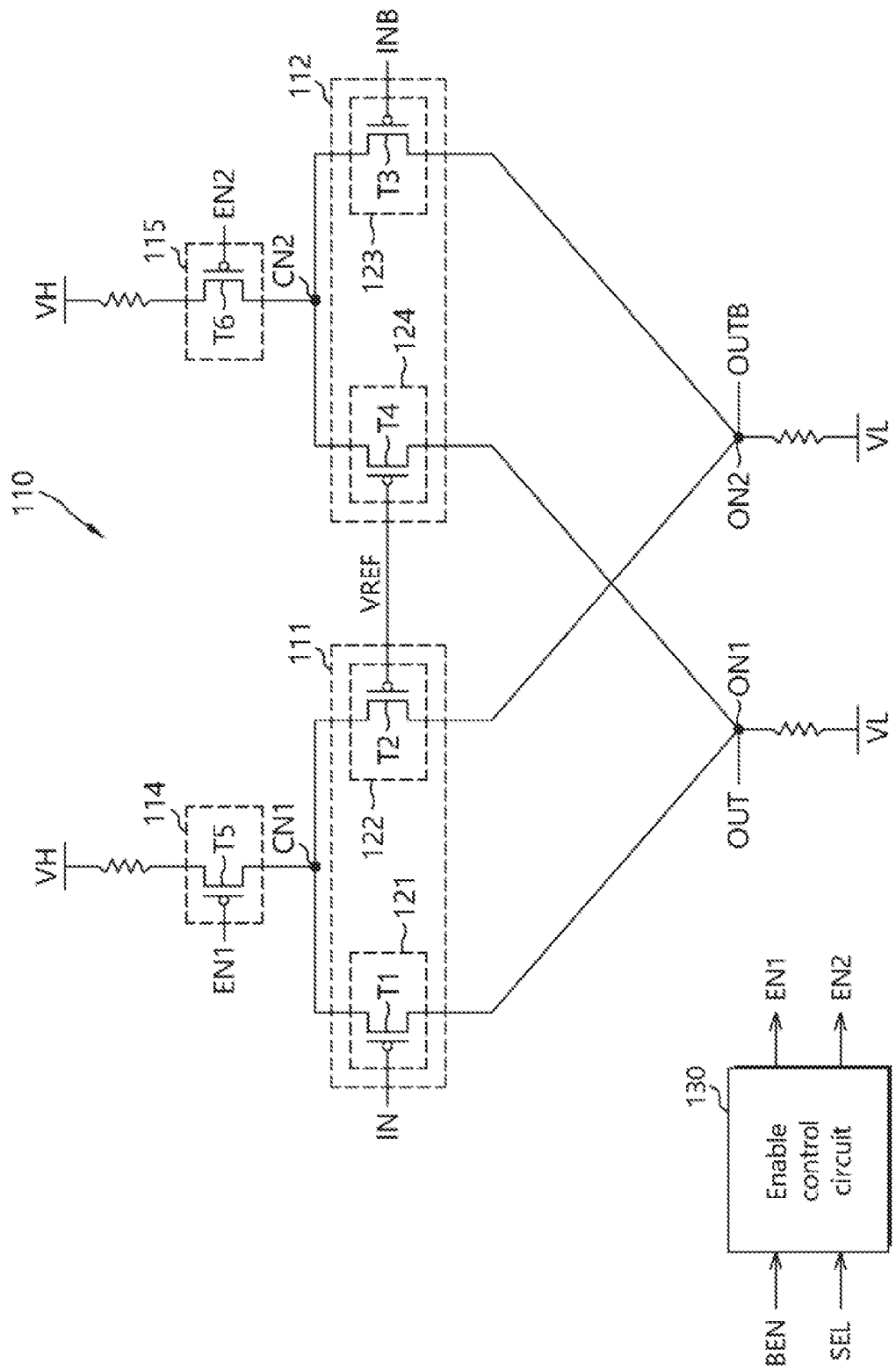
FIG. 1 is a diagram illustrating a configuration of a receiving circuit in accordance with an embodiment.

FIG. 1 is a diagram illustrating a configuration of a receiving circuit 100 in accordance with an embodiment. In FIG. 1, the receiving circuit 100 may include an amplifier 110. The amplifier 110 may differentially amplify one input signal and a reference voltage VREF depending on an amplification mode and generate output signals OUT and OUTB. The amplifier 110 may receive at least one input signal. For example, the amplifier 110 may receive one of an input signal IN and a complementary input signal INB. The input signal IN and the complementary input signal INB may be a pair of differential signals which have opposite levels. The reference voltage VREF may have a voltage level corresponding to, for example, the middle of the swing range of the input signal IN or the complementary input signal INB. When receiving the input signal IN, the amplifier 110 may differentially amplify the input signal IN and the reference voltage VREF and generate the output signals OUT and OUTB. When receiving the complementary input signal INB, the amplifier 110 may differentially amplify the complementary input signal INB and the reference voltage VREF and generate the output signals OUT and OUTB.

In FIG. 1, the amplifier 110 may include a first amplification circuit 111, a second amplification circuit 112, a first enable circuit 114, and a second enable circuit 115. The first amplification circuit 111 may receive the input signal IN and the reference voltage VREF. The first amplification circuit 111 may differentially amplify the input signal IN and the reference voltage VREF and generate the output signals OUT and OUTB. The output signals OUT and OUTB may be a pair of differential signals. The first amplification circuit 111 may be coupled between a first common node CN1 and a first output node ON1 and a second output node ON2. The first amplification circuit 111 may change the voltage levels of the first output node ON1 and the second output node ON2 based on the input signal IN and the reference voltage VREF and generate the output signals OUT and OUTB. The output signal OUT may be generated from the first output node ON1, and the complementary output signal OUTB may be generated from the second output node ON2. The second amplification circuit 112 may receive the complementary input signal INB and the reference voltage VREF, The second amplification circuit 112 may differentially amplify the complementary input signal INB and the reference voltage VREF and generate the output signals OUT and OUTB. The second amplification circuit 112 may be coupled between a second common node CN2 and the first output node ON1 and the second output node ON2. The second amplification circuit 112 may change the voltage levels of the first output node ON1 and the second output node ON2 based on the complementary input signal INB and the reference voltage VREF and generate the output signals OUT and OUTB.

The first enable circuit 114 may receive a first enable signal EN1 The first enable circuit 114 may activate the first amplification circuit 111 based on the first enable signal EN1, The first enable signal EN1 may be enabled, for example, when the receiving circuit 100 receives the input signal IN, and activate the first amplification circuit 111. The first enable circuit 114 may activate the first amplification circuit 111 by forming the current path of the first common node CN1. The second enable circuit 115 may receive a second enable signal EN2. The second enable circuit 115 may activate the second amplification circuit 112 based on the second enable signal EN2. The second enable circuit 115 may activate the second amplification circuit 112 by forming the current path of the second common node CN2. The second enable signal EN2 may be enabled, for example, when the receiving circuit 100 receives the complementary input signal INB, and activate the second amplification circuit 112. The first and second enable circuits 114 and 115 may selectively operate the first and second amplification circuits 111 and 112 such that the amplifier 110 may differentially amplify the input signal IN and the reference voltage VREF or differentially amplify the complementary input signal INB and the reference voltage VREF.

In FIG. 1, the receiving circuit 100 may further include an enable control circuit 130. The enable control circuit 130 may generate the first enable signal EN1 and the second enable signal EN2 based on a receiving select signal SEL. For example, the receiving select signal SEL may have a logic high level when the input signal IN is received in the receiving circuit 100, and may have a logic low level when the complementary input signal INB is received in the receiving circuit 100. The enable control circuit 130 may enable the first enable signal EN1 when the receiving select signal SEL is the logic high level, and may enable the second enable signal EN2 when the receiving select signal SEL is the logic low level. The enable control circuit 130 may further receive a buffer enable signal BEN. The buffer enable signal BEN may be a signal which instructs the activation of the receiving circuit 100 and the amplifier 110. The enable control circuit 130 may enable the first and second enable signals EN1 and EN2 depending on the receiving select signal SEL when the buffer enable signal BEN is enabled.

In FIG. 1, the first amplification circuit 111 may include a first input circuit 121 and a second input circuit 122. The first input circuit 121 may receive the input signal IN and change the voltage level of the first output node ON1. The first input circuit 121 may be coupled between the first common node CN1 and the first output node ON1, and may change the voltage level of the first output node ON1 depending on the level of the input signal IN. The second input circuit 122 may receive the reference voltage VREF and change the voltage level of the second output node ON2. The second input circuit 122 may be coupled between the first common node CN1 and the second output node ON2, and may change the voltage level of the second output node ON2 depending on the reference voltage VREF. The second amplification circuit 112 may include a third input circuit 123 and a fourth input circuit 124. The third input circuit 123 may receive the complementary input signal INB and change the voltage level of the second output node ON2. The third input circuit 123 may be coupled between the second common node CN2 and the second output node ON2, and may change the voltage level of the second output node ON2 depending on the level of the complementary input signal INB. The fourth input circuit 124 may receive the reference voltage VREF and change the voltage level of the first output node ON1. The fourth input circuit 124 may be coupled between the second common node CN2 and the first output node ON1, and may change the voltage level of the first output node ON1 depending on the reference voltage VREF.

The first enable circuit 114 may be coupled between the terminal of a first power supply voltage VH and the first common node CN1. The first enable circuit 114 may form a current path from the terminal of the first power supply voltage VH to the first common node CN1, based on the first enable signal EN1. The first enable circuit 114 may form a current path through the first enable circuit 114 to the first common node CN1, based on the first enable signal EN1. A degeneration resistor and/or a load resistor may be coupled between the terminal of the first power supply voltage VH and the first enable circuit 114. The second enable circuit 115 may be coupled between the terminal of the first power supply voltage VH and the second common node CN2. The second enable circuit 115 may form a current path from the terminal of the first power supply voltage VH to the second common node CN2, based on the second enable signal EN2. The second enable circuit 115 may form a current path through the second enable circuit 115 to the second common node CN2, based on the second enable signal EN2. A degeneration resistor and/or a load resistor may be coupled between the terminal of the first power supply voltage VH and the second enable circuit 115. The first output node ON1 may be coupled with the terminal of a second power supply voltage VL. The second power supply voltage VL may have a level lower than the first power supply voltage VH. The first output node ON1 may be coupled with the terminal of the second power supply voltage VL through a degeneration resistor and/or a load resistor. The second output node ON2 may be coupled with the terminal of the second power supply voltage VL. The second output node ON2 may be coupled with the terminal of the second power supply voltage VL through a degeneration resistor and/or a load resistor.

In FIG. 1, the first input circuit 121 may include a first transistor T1. The first transistor T1 may be, for example, a P-channel metal oxide semiconductor (MOS) transistor. The first transistor T1 may have a gate which receives the input signal IN, a source which is coupled with the first common node CN1 and a drain which is coupled with the first output node ON1. The second input circuit 122 may include a second transistor T2. The second transistor T2 may be, for example, a P-channel MOS transistor. The second transistor T2 may have a gate which receives the reference voltage VREF, a source which is coupled with the first common node CN1 and a drain which is coupled with the second output node ON2. The third input circuit 123 may include a third transistor T3. The third transistor T3 may be, for example, a P-channel MOS transistor. The third transistor T3 may have a gate which receives the complementary input signal INB, a source which is coupled with the second common node CN2 and a drain which is coupled with the second output node ON2. The fourth input circuit 124 may include a fourth transistor T4. The fourth transistor T4 may be, for example, a P-channel MOS transistor. The fourth transistor T4 may have a gate which receives the reference voltage VREF, a source which is coupled with the second common node CN2 and a drain which is coupled with the first output node ON1. The first enable circuit 114 may include a fifth transistor T5. The fifth transistor T5 may be, for example, a P-channel MOS transistor. The fifth transistor T5 may have a gate which receives the first enable signal EN1, a source which is coupled with the terminal of the first power supply voltage VH and a drain which is coupled with the first common node CN1. The second enable circuit 115 may include a sixth transistor T6. The sixth transistor T6 may be, for example, a P-channel MOS transistor. The sixth transistor T6 may have a gate which receives the second enable signal EN2, a source which is coupled with the terminal of the first power supply voltage VH and a drain which is coupled with the second common node CN2. In an embodiment, the first power supply voltage VH may have a level lower than the second power supply voltage VL, and the first to sixth transistors T1, T2, T3, T4, T5, and T6 which configure the first to fourth input circuits 121, 122, 123, and 124 and the first and second enable circuits 114 and 115 may be changed to N-channel MOS transistors.

When the receiving circuit 100 receives the input signal IN, the amplifier 110 may differentially amplify the input signal IN inputted as a single-ended signal and the reference voltage VREF and generate the output signals OUT and OUTB. When the receiving circuit 100 receives the input signal IN, the enable control circuit 130 may enable the first enable signal EN1 and disable the second enable signal EN2. The first enable circuit 114 may activate the first amplification circuit 111, and the second enable circuit 115 may deactivate the second amplification circuit 112. Accordingly, the first amplification circuit 111 may change the voltage levels of the first and second output nodes ON1 and ON2 based on the input signal IN and the reference voltage VREF and thereby generate the output signals OUT and OUTB. When the receiving circuit 100 receives the complementary input signal INB, the amplifier 110 may differentially amplify the complementary input signal INB inputted as a single-ended signal and the reference voltage VREF and generate the output signals OUT and OUTB. When the receiving circuit 100 receives the complementary input signal INB, the enable control circuit 130 may enable the second enable signal EN2 and disable the first enable signal EN1. The second enable circuit 115 may activate the second amplification circuit 112, and the first enable circuit 114 may deactivate the first amplification circuit 111. Accordingly, the second amplification circuit 112 may change the voltage levels of the first and second output nodes ON1 and ON2 based on the complementary input signal INB and the reference voltage VREF and thereby generate the output signals OUT and OUTB.

Figure 2:
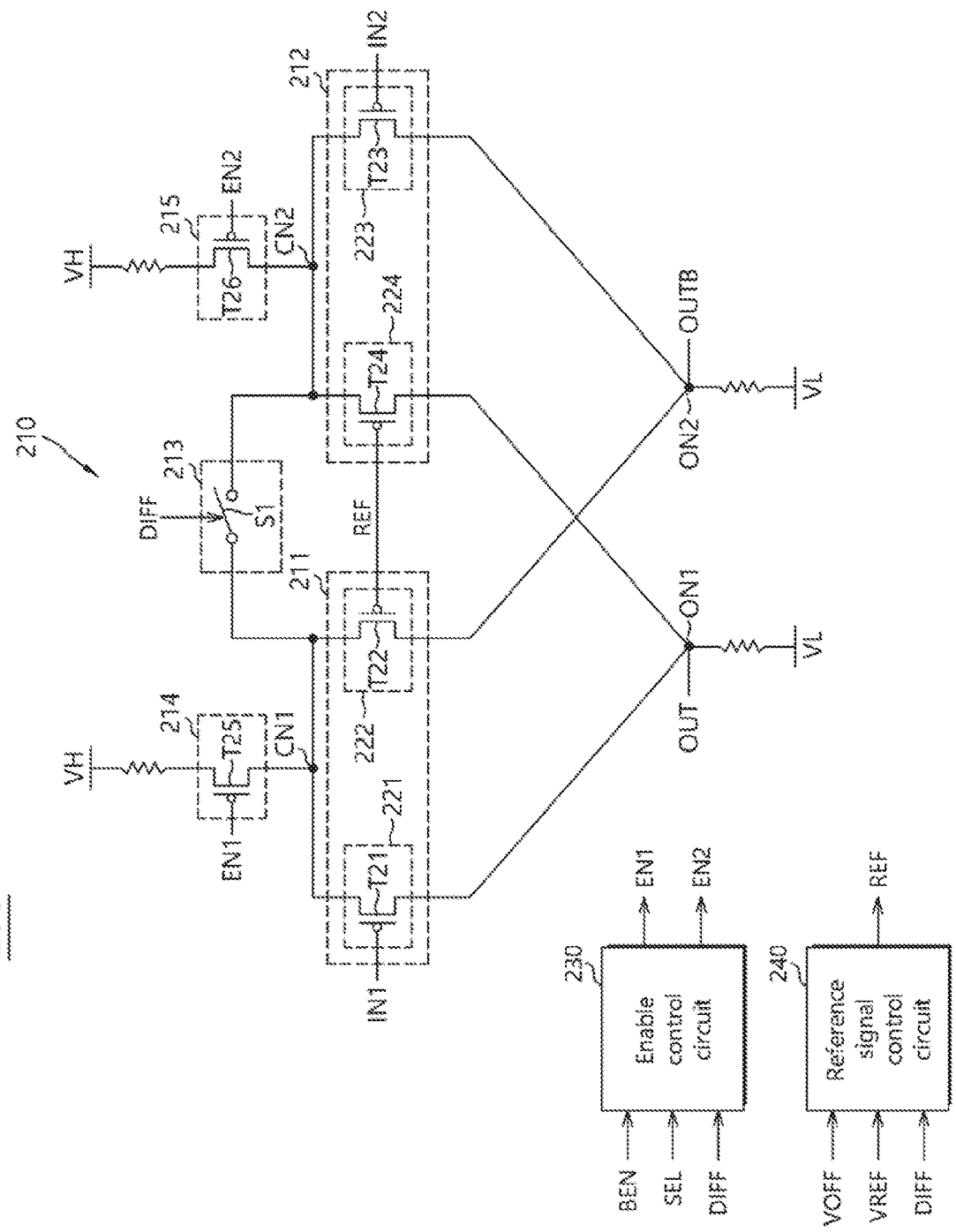
FIG. 2 is a diagram illustrating a configuration of a receiving circuit in accordance with an embodiment.

FIG. 2 is a diagram illustrating a configuration of a receiving to circuit 200 in accordance with an embodiment. In FIG. 2, the receiving circuit 200 may include an amplifier 210. The amplifier 210 may receive a first input signal IN1, a second input signal IN2, and a reference signal REF. The amplifier 210 may generate output signals OUT and OUTB by differentially amplifying two input signals and generate the output signals OUT and OUTB by differentially amplifying any one of the two input signals and the reference signal REF, depending on an amplification mode. When the first and second input signals IN1 and IN2 are received, the amplifier 210 may generate the output signals OUT and OUTB by differentially amplifying the first and second input signals IN1 and IN2. In an embodiment, the first and second input signals IN1 and IN2 may be a pair of differential signals. When the first input signal IN1 is received, the amplifier 210 may generate the output signals OUT and OUTB by differentially amplifying the first input signal IN1 and the reference signal REF. When the second input signal IN2 is received, the amplifier 210 may generate the output signals OUT and OUTB by differentially amplifying the second input signal IN2 and the reference signal REF. The reference signal REF may have different characteristics depending on the amplification mode. For example, the reference signal REF may have various voltage levels depending on the amplification mode.

In FIG. 2, the amplifier 210 may include a first amplification circuit 211, a second amplification circuit 212, and an amplification control circuit 213. The first amplification circuit 211 may receive the first input signal IN1 and the reference signal REF. The first amplification circuit 211 may differentially amplify the first input signal IN1 and the reference signal REF and generate the output signals OUT and OUTB. The first amplification circuit 211 may be coupled between a first common node CN1 and a first output node ON1 and a second output node ON2. The first amplification circuit 211 may change the voltage levels of the first output node ON1 and the second output node ON2 based on the first input signal IN1 and the reference signal REF and generate the output signals OUT and OUTB. The second amplification circuit 212 may receive the second input signal IN2 and the reference signal REF. The second amplification circuit 212 may differentially amplify the second input signal IN2 and the reference signal REF and generate the output signals OUT and OUTB. The second amplification circuit 212 may be coupled between a second common node CN2 and the first output node ON1 and the second output node ON2. The second amplification circuit 212 may change the voltage levels of the first output node ON1 and the second output node ON2 based on the second input signal IN2 and the reference signal REF and generate the output signals OUT and OUTB.

The amplification control circuit 213 may receive an amplification mode signal DIFF. The amplification control circuit 213 may couple the first and second common nodes CN1 and CN2 based on the amplification mode signal DIFF. When the amplifier 210 receives both the first and second input signals IN1 and IN2 and differentially amplifies the first and second input signals IN1 and IN2, the amplification control circuit 213 may couple the first and second common nodes CN1 and CN2 based on the amplification mode signal DIFF. When the amplifier 210 receives any one of the first and second input signals IN1 and IN2 and differentially amplifies the any one of the first and second input signals IN1 and IN2 and the reference signal REF, the amplification control circuit 213 may decouple the first and second common nodes CN1 and CN2 based on the amplification mode signal DIFF, The amplification control circuit 213 may selectively couple or decouple the first and second common nodes CN1 and CN2 based on the amplification mode signal DIFF.

In FIG. 2, the amplifier 210 may further include a first enable circuit 214 and a second enable circuit 215. The first enable circuit 214 may receive a first enable signal EN1. The first enable circuit 214 may activate the first amplification circuit 211 based on the first enable signal EN1. The first enable signal EN1 may be enabled, for example, when the amplifier 210 receives the first input signal IN1, and activate the first amplification circuit 211, The first enable circuit 214 may activate the first amplification circuit 211 by forming the current path of the first common node CN1. The second enable circuit 215 may receive a second enable signal EN2. The second enable circuit 215 may activate the second amplification circuit 212 based on the second enable signal EN2. The second enable circuit 215 may activate the second amplification circuit 212 by forming the current path of the second common node CN2. The second enable signal EN2 may be enabled, for example, when the amplifier 210 receives the second input signal IN2, and activate the second amplification circuit 212. The first and second enable circuits 214 and 215 may operate at least one of the first and second amplification circuits 211 and 212 such that the amplifier 210 may amplify the first and second input signals IN1 and IN2.

In FIG. 2, the receiving circuit 200 may further include an enable control circuit 230 and a reference signal control circuit 240. The enable control circuit 230 may generate the first and second enable signals EN1 and EN2 based on a receiving select signal SEL and the amplification mode signal DIFF. For example, the receiving select signal SEL may have a logic high level when the first input signal IN1 is received, and may have a logic low level when the second input signal IN2 is received. The amplification mode signal DIFF may have a logic high level in a first amplification mode, and may have a logic low level in a second amplification mode. The first amplification mode may mean an operation mode in which the receiving circuit 200 receives both the first and second input signals IN1 and IN2 and differentially amplifies the first and second input signals IN1 and IN2. The second amplification mode may mean an operation mode in which the receiving circuit 200 receives any one of the first and second input signals IN1 and IN2 and differentially amplifies the any one input signal (i.e., first input signal IN1 or second input signal IN2) and the reference signal REF. The enable control circuit 230 may enable both the first and second enable signals EN1 and EN2 regardless of the receiving select signal SEL when the amplification mode signal DIFF is the logic high level. The enable control circuit 230 may enable any one of the first and second enable signals EN1 and EN2 depending on the receiving select signal SEL when the amplification mode signal DIFF is the logic low level. For example, if the receiving select signal SEL is the logic high level, the enable control circuit 230 may enable the first enable signal EN1 and disable the second enable signal EN2. If the receiving select signal SEL is the logic low level, the enable control circuit 230 may enable the second enable signal EN2 and disable the first enable signal EN1.

The enable control circuit 230 may further receive a buffer enable signal BEN. The buffer enable signal BEN may be a signal which instructs the activation of the receiving circuit 200 and the amplifier 210. The enable control circuit 230 may enable the first and second enable signals EN1 and EN2 based on the receiving select signal SEL and the amplification mode signal DIFF when the buffer enable signal BEN is enabled.

The reference signal control circuit 240 may generate the reference signal REF which has various characteristics, based on the amplification mode signal DIFF. For example, the reference signal control circuit 240 may receive an off voltage VOFF and a reference voltage VREF, and may provide one of the off voltage VOFF and the reference voltage VREF as the reference signal REF based on the amplification mode signal DIFF. For example, the reference signal control circuit 240 may output the off voltage VOFF as the reference signal REF when the amplification mode signal DIFF is the logic high level, and may output the reference voltage VREF as the reference signal REF when the amplification mode signal DIFF is the logic low level.

In FIG. 2, the first amplification circuit 211 may include a first input circuit 221 and a second input circuit 222. The first input circuit 221 may receive the first input signal IN1 and change the voltage level of the first output node ON1. The first input circuit 221 may be coupled between the first common node CN1 and the first output node ON1, and may change the voltage level of the first output node ON1 depending on the level of the first input signal IN1, The second input circuit 222 may receive the reference signal REF and change the voltage level of the second output node ON2. The second input circuit 222 may be coupled between the first common node CN1 and the second output node ON2, and may change the voltage level of the second output node ON2 depending on the level of the reference signal REF.

The second amplification circuit 212 may include a third input circuit 223 and a fourth input circuit 224. The third input circuit 223 may receive the second input signal IN2 and change the voltage level of the second output node ON2. The third input circuit 223 may be coupled between the second common node CN2 and the second output node ON2, and may change the voltage level of the second output node ON2 depending on the level of the second input signal IN2. The fourth input circuit 224 may receive the reference signal REF and change the voltage level of the first output node ON1. The fourth input circuit 224 may be coupled between the second common node CN2 and the first output node ON1, and may change the voltage level of the first output node ON1 depending on the level of the reference signal REF. In an embodiment, the off voltage VOFF may have a voltage level that is sufficient to turn off and/or deactivate the second input circuit 222 and the fourth input circuit 224. For example, when the second and fourth input circuits 222 and 224 are configured by P-channel MOS transistors, the off voltage VOFF may have a voltage level corresponding to a first power supply voltage VH.

The first enable circuit 214 may be coupled between the terminal of the first power supply voltage VH and the first common node CN1. The first enable circuit 214 may form a current path from the terminal of the first power supply voltage VH to the first common node CN1, based on the first enable signal EN1. The first enable circuit 214 may form a current path through the first enable circuit 214 to the first common node CN1, based on the first enable signal EN1. A degeneration resistor and/or a load resistor may be coupled between the terminal of the first power supply voltage VH and the first enable circuit 214. The second enable circuit 215 may be coupled between the terminal of the first power supply voltage VH and the second common node CN2. The second enable circuit 215 may form a current path from the terminal of the first power supply voltage VH to the second common node CN2, based on the second enable signal EN2. The second enable circuit 215 may form a current path through the second enable circuit 215 to the second common node CN2, based on the second enable signal EN2. A degeneration resistor and/or a load resistor may be coupled between the terminal of the first power supply voltage VH and the second enable circuit 215. The first output node ON1 may be coupled with the terminal of a second power supply voltage VL. The second power supply voltage VL may have a level lower than the first power supply voltage VH. The first output node ON1 may be coupled with the terminal of the second power supply voltage VL through a degeneration resistor and/or a load resistor. The second output node ON2 may be coupled with the terminal of the second power supply voltage VL. The second output node ON2 may be coupled with the terminal of the second power supply voltage VL through a degeneration resistor and/or a load resistor.

In FIG. 2, the first input circuit 221 may include a first transistor T21. The first transistor T21 may be, for example, a P-channel MOS transistor. The first transistor T21 may have a gate which receives the first input signal IN1, a source which is coupled with the first common node CN1 and a drain which is coupled with the first output node ON1. The second input circuit 222 may include a second transistor T22. The second transistor T22 may be, for example, a P-channel MOS transistor. The second transistor T22 may have a gate which receives the reference signal REF, a source which is coupled with the first common node CN1 and a drain which is to coupled with the second output node ON2. The third input circuit 223 may include a third transistor T23. The third transistor T23 may be, for example, a P-channel MOS transistor. The third transistor T23 may have a gate which receives the second input signal 1112, a source which is coupled with the second common node CN2 and a drain which is coupled with the second output node ON2. The fourth input circuit 224 may include a fourth transistor T24. The fourth transistor T24 may be, for example, a P-channel MOS transistor. The fourth transistor T24 may have a gate which receives the reference signal REF, a source which is coupled with the second common node CN2 and a drain which is coupled with the first output node ON1.

The amplification control circuit 213 may include a switch S1. The switch S1 may be turned on based on the amplification mode signal DIFF. For example, the switch S1 may be turned on by receiving the amplification mode signal DIFF which has the logic high level, and may electrically couple the first and second common nodes CN1 and CN2. The switch S1 may be turned off by receiving the amplification mode signal DIFF which has the logic low level, and may electrically decouple the first and second common nodes CN1 and CN2. The first enable circuit 214 may include a fifth transistor T25. The fifth transistor T25 may be, for example, a P-channel MOS transistor. The fifth transistor T25 may have a gate which receives the first enable signal EN1, a source which is coupled with the terminal of the first power supply voltage VH and a drain which is coupled with the first common node CN1. The second enable circuit 215 may include a sixth transistor T26. The sixth transistor T26 may be, for example, a P-channel MOS transistor. The sixth transistor T26 may have a gate which receives the second enable signal EN2, a source which is coupled with the terminal of the first power supply voltage VH and a drain which is coupled with the second common node CN2. In an embodiment, the first power supply voltage VH may have a level lower than the second power supply voltage VL, and the first to sixth transistors T21, T22, T23, T24, T25, and T26 which configure the first to fourth input circuits 221, 222, 223, and 224 and the first and second enable circuits 214 and 215 may be changed to N-channel MOS transistors.

The receiving circuit 200 may operate as in the following table. The operation of the receiving circuit 200 in accordance with an embodiment will be described below with reference to FIG. 2 and the following table.

| BEN | SEL | DIFF | EN1 | EN2 | REF |
|---|---|---|---|---|---|
| Enable | H | L | Enable | Disable | VREF |
| Enable | L | L | Disable | Enable | VREF |
| Enable | Don't care | H | Enable | Enable | VOFF |
| Disable | Don't care | Don't care | Disable | Disable | Don't care |

When the buffer enable signal BEN is enabled, the enable control circuit 230 may generate the first and second enable signals EN1 and EN2 based on the receiving select signal SEL and the amplification mode signal DIFF. When the receiving circuit 200 operates to receive the first input signal IN1, the amplification mode signal DIFF may have the logic low level. The amplification control circuit 213 may electrically decouple the first common node CN1 and the second common node CN2 based on the amplification mode signal DIFF. The enable control circuit 230 may enable the first enable signal EN1 and disable the second enable signal EN2 based on the receiving select signal SEL which has the logic high level. The reference signal control circuit 240 may generate the reference signal REF which has the level of the reference voltage VREF, based on the amplification mode signal DIFF which has the logic low level. The first enable circuit 214 may activate the first amplification circuit 211 based on the first enable signal EN1, and the first amplification circuit 211 may generate the output signals OUT and OUTB by differentially amplifying the first input signal IN1 and the reference signal REF which has the level of the reference voltage VREF.

When the receiving circuit 200 operates to receive the second input signal IN2, the amplification mode signal DIFF may have the logic low level, and the enable control circuit 230 may enable the second enable signal EN2 and disable the first enable signal EN1 based on the receiving select signal SEL which has the logic low level. The reference signal control circuit 240 may generate the reference signal REF which has the level of the reference voltage VREF, based on the amplification mode signal DIFF which has the logic low level. The second enable circuit 215 may activate the second amplification circuit 212 based on the second enable signal EN2, and the second amplification circuit 212 may generate the output signals OUT and OUTB by differentially amplifying the second input signal IN2 and the reference signal REF which has the level of the reference voltage VREF.

When the receiving circuit 200 operates to receive both the first and second input signals IN1 and IN2, the amplification mode signal DIFF may have the logic high level. The amplification control circuit 213 may electrically couple the first common node CN1 and the second common node CN2 based on the amplification mode signal DIFF. The enable control circuit 230 may enable both the first and second enable signals EN1 and EN2 regardless of the receiving select signal SEL. The reference signal control circuit 240 may generate the reference signal REF which has the level of the off voltage VOFF, based on the amplification mode signal DIFF which has the logic high level. The first and second enable circuits 214 and 215 may activate the first amplification circuit 211 and the second amplification circuit 212, respectively. The second input circuit 222 and the fourth input circuit 224 which receive the reference signal REF having the level of the off voltage VOFF may be turned off and/or deactivated. Therefore, the first input circuit 221 of the first amplification circuit 211 may change the voltage level of the first output node ON1 based on the first input signal IN1, and the third input circuit 223 of the second amplification circuit 212 may change the voltage level of the second output node ON2 based on the second input signal IN2. Thus, the first input circuit 221 and the third input circuit 223 may operate like one amplification circuit, and may generate the output signals OUT and OUTB by differentially amplifying the first and second input signals IN1 and IN2. Since the second input circuit 222 and the fourth input circuit 224 are turned off based on the reference signal REF having the level of the off voltage VOFF, they may not exert an influence on a change in the voltage levels of the first and second output nodes ON1 and ON2. In particular, kickback noise likely to be introduced to the first and second output nodes ON1 and ON2 from the second input circuit 222 and the fourth input circuit 224 may be blocked. When the buffer enable signal BEN is disabled, the enable control circuit 230 may disable the first and second enable signals EN1 and EN2 regardless of the receiving select signal SEL and the amplification mode signal DIFF, and the receiving circuit 200 and the amplifier 210 may be deactivated.

Figure 3:
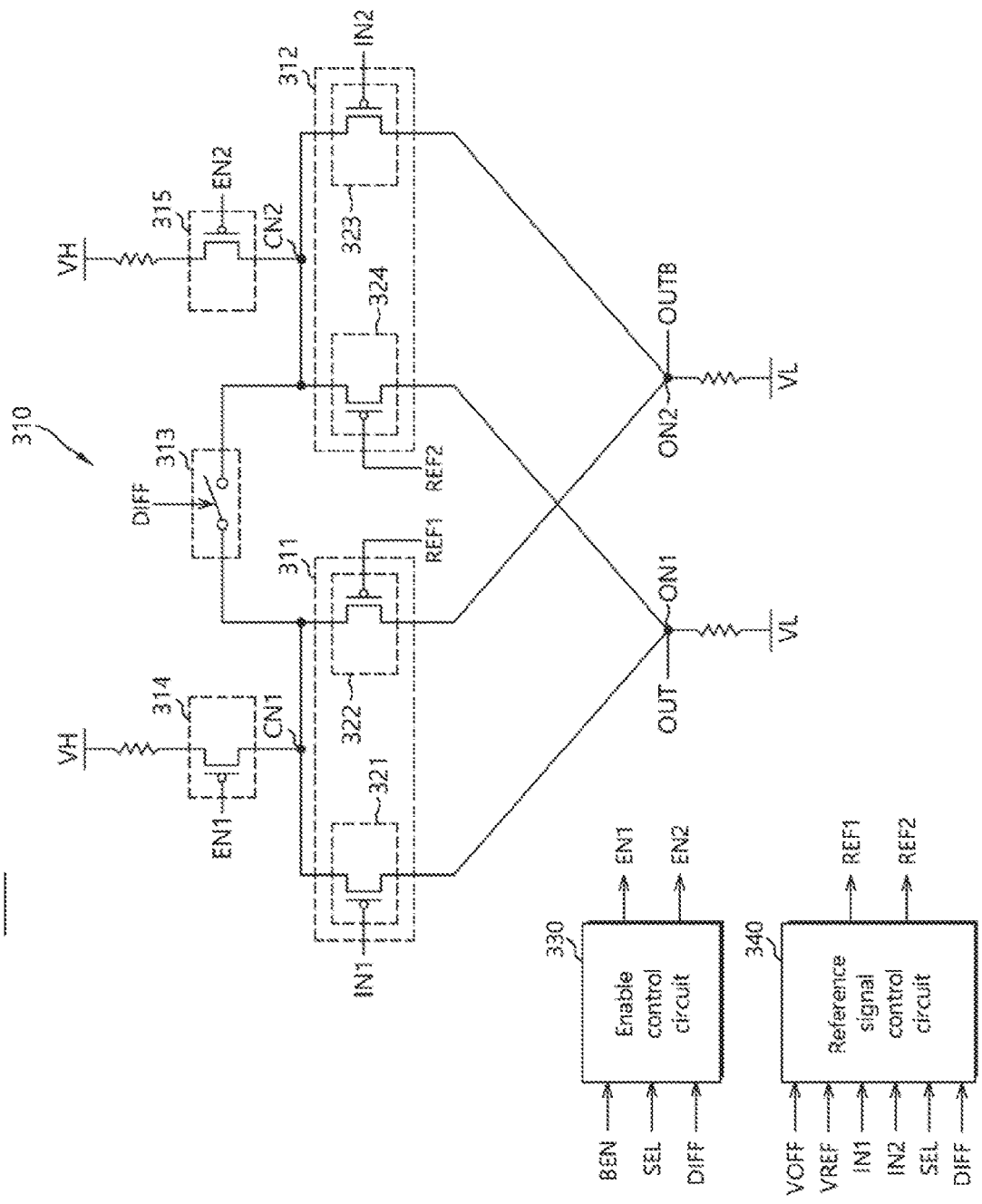
FIG. 3 is a diagram illustrating a configuration of a receiving circuit in accordance with an embodiment.

FIG. 3 is a diagram illustrating a configuration of a receiving circuit 300 in accordance with an embodiment. In FIG. 3, the receiving circuit 300 may include an amplifier 310, an enable control circuit 330, and a reference signal control circuit 340. The amplifier 310 may include a first amplification circuit 311, a second amplification circuit 312, an amplification control circuit 313, a first enable circuit 314, and a second enable circuit 315. The first amplification circuit 311 may include a first input circuit 321 and a second input circuit 322, and the second amplification circuit 312 may include a third input circuit 323 and a fourth input circuit 324. The first input circuit 321 may receive a first input signal IN1, and the second input circuit 322 may receive a first reference signal REF1. The third input circuit 323 may receive a second input signal IN2, and the fourth input circuit 324 may receive a second reference signal REF2. The amplifier 310 may have substantially the same configuration as the amplifier 210 illustrated in FIG. 2 except that the second input circuit 322 receives the first reference signal REF1 and the fourth input circuit 324 receives the second reference signal REF2. The enable control circuit 330 may have the same configuration and operate in the same manner as the enable control circuit 230 illustrated in FIG. 2. Repeated descriptions for the same components will be omitted herein. Unlike the amplifier 210 illustrated in FIG. 2, in the amplifier 310, a reference signal to be inputted to the second input circuit 322 and the fourth input circuit 324 is divided into the first and second reference signals REF1 and REF2.

The reference signal control circuit 340 may provide one of an off voltage VOFF, a reference voltage VREF, the first input signal IN1, and the second input signal IN2, as each of the first reference signal REF1 and the second reference signal REF2, based on an amplification mode signal DIFF and a receiving select signal SEL. The reference signal control circuit 340 may output one of the off voltage VOFF, the reference voltage VREF, and the first input signal IN1 as the first reference signal REF1, based on the amplification mode signal DIFF and the receiving select signal SEL. The reference signal control circuit 340 may output one of the off voltage VOFF, the reference voltage VREF, and the second input signal IN2 as the second reference signal REF2, based on the amplification mode signal DIFF and the receiving select signal SEL.

FIG. 4 is a diagram illustrating a configuration of the reference signal control circuit 340 illustrated in FIG. 3. In FIG. 4, the reference signal control circuit 340 may include a first signal selector 410 and a second signal selector 420. The first signal selector 410 may receive the off voltage VOFF, the reference voltage VREF, the first input signal IN1, the receiving select signal SEL, and the amplification mode signal DIFF. The first signal selector 410 may output one of the off voltage VOFF, the reference voltage VREF, and the first input signal IN1 as the first reference signal REF1, based on the receiving select signal SEL and the amplification mode signal DIFF. The second signal selector 420 may receive the off voltage VOFF, the reference voltage VREF, the second input signal IN2, the receiving select signal SEL, and the amplification mode signal DIFF. The second signal selector 420 may output one of the off voltage VOFF, the reference voltage VREF, and the second input signal IN2 as the second reference signal REF2, based on the receiving select signal SEL and the amplification mode signal DIFF.

The reference signal control circuit 340 may operate as in the following table. The operation of the receiving circuit 300 in accordance with an embodiment will be described below with reference to FIG. 3 and the following table.

| SEL | DIFF | REF1 | REF2 |
|---|---|---|---|
| H | L | VREF | IN2 |
| L | L | IN1 | VREF |
| Don't care | H | VOFF | VOFF |

When the receiving circuit 300 operates to receive the first input signal IN1, the receiving select signal SEL may have a logic high level and the amplification mode signal DIFF may have a logic low level. Thus, the first amplification circuit 311 may be activated, and may differentially amplify the first input signal IN1 and the first reference signal REF1 and generate output signals OUT and OUTB. The reference signal control circuit 340 may generate the first reference signal REF1 which has the level of the reference voltage VREF and generate the second input signal IN2 as the second reference signal REF2, based on the receiving select signal SEL which has the logic high level. In the case where the second input signal IN2 is outputted as the second reference signal REF2, both the third input circuit 323 and the fourth input circuit 324 of the second amplification circuit 312 may receive the second input signal IN2. Therefore, the third input circuit 323 and the fourth input circuit 324 of the second amplification circuit 312 which is deactivated may provide the same loading to the first and second output nodes ON1 and ON2. Since the first and second output nodes ON1 and ON2 are influenced in the same way by the third and fourth input circuits 323 and 324 of the second amplification circuit 312 which is deactivated, the voltage levels of the first and second output nodes ON1 and ON2 may be accurately changed by only the differential amplifying operation of the first amplification circuit 311.

When the receiving circuit 300 operates to receive the second input signal IN2, the receiving select signal SEL may have a logic low level and the amplification mode signal DIFF may have the logic low level. Thus, the second amplification circuit 312 may be activated, and may differentially amplify the second input signal IN2 and the second reference signal REF2 and generate the output signals OUT and OUTB. The reference signal control circuit 340 may generate the first input signal IN1 as the first reference signal REF1 and generate the second reference signal REF2 which has the level of the reference voltage VREF, based on the receiving select signal SEL which has the logic low level. In the case where the first input signal IN1 is outputted as the first reference signal REF1, both the first input circuit 321 and the second input circuit 322 of the first amplification circuit 311 may receive the first input signal IN1. Therefore, the first input circuit 321 and the second input circuit 322 of the first amplification circuit 311 which is deactivated may provide the same loading to the first and second output nodes ON1 and ON2. Since the first and second output nodes ON1 and ON2 are influenced in the same way by the first and second input circuits 321 and 322 of the first amplification circuit 311 which is deactivated, the voltage levels of the first and second output nodes ON1 and ON2 may be accurately changed by only the differential amplifying operation of the second amplification circuit 312.

When the receiving circuit 300 operates to receive both the first and second input signals IN1 and IN2, the amplification mode signal DIFF may have a logic high level. The reference signal control circuit 340 may generate the first and second reference signals REF1 and REF2 which have the level of the off voltage VOFF. The amplification control circuit 313 may electrically couple the first and second common nodes CN1 and CN2 based on the amplification mode signal DIFF. Thus, the first input circuit 321 of the first amplification circuit 311 and the third input circuit 323 of the second amplification circuit 312 may operate like one amplification circuit, and the amplifier 310 may generate the output signals OUT and OUTB by differentially amplifying the first and second input signals IN1 and IN2.

Figure 5:
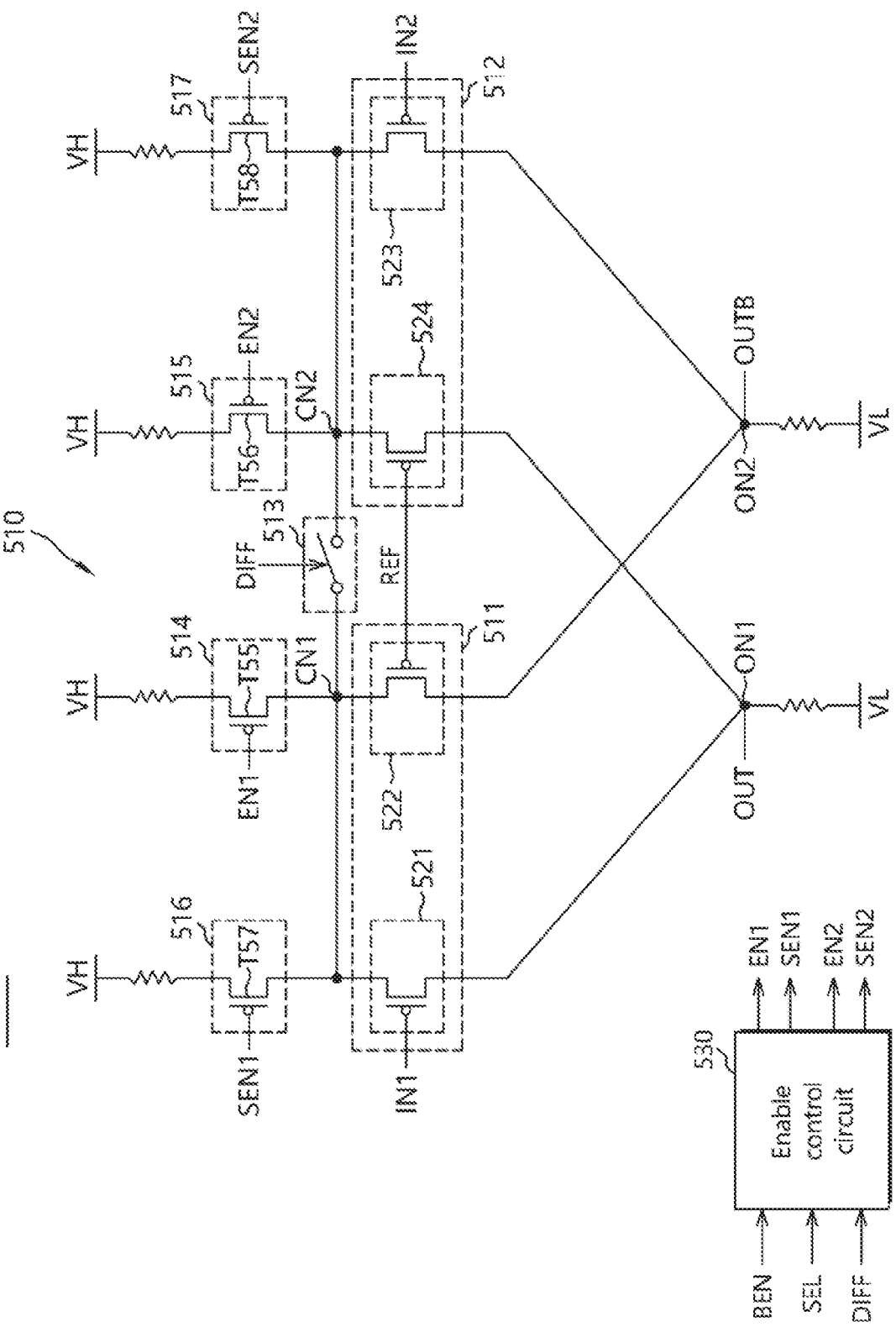
FIG. 5 is a diagram illustrating a configuration of a receiving circuit in accordance with an embodiment.

FIG. 5 is a diagram illustrating a configuration of a receiving circuit 500 in accordance with an embodiment. In FIG. 5, the receiving circuit 500 may include an amplifier 510 and an enable control circuit 530. The amplifier 510 may include a first amplification circuit 511, a second amplification circuit 512, and an amplification control circuit 513. The first amplification circuit 511 may include a first input circuit 521 and a second input circuit 522, and the second amplification circuit 512 may include a third input circuit 523 and a fourth input circuit 524. In FIG. 5, the amplifier 510 may include a first enable circuit 514 and a second enable circuit 515. The amplifier 510 may have substantially the same configuration as the amplifier 210 illustrated in FIG. 2, and repeated descriptions for the same components will be omitted herein. The amplifier 510 may further include a third enable circuit 516 and a fourth enable circuit 517. The third enable circuit 516 may receive a first sub enable signal SEN1, The third enable circuit 516 may be coupled between the terminal of a first power supply voltage VH and a first common node CN1, and may form the current path of the first amplification circuit 511 and/or the first common node CN1 based on the first sub enable signal SEN1. The third enable circuit 516 may form the current path through the third enable circuit 516 to the first amplification circuit 511 and/or the first common node CN1, based on the first sub enable signal SEN1. The fourth enable circuit 517 may receive a second sub enable signal SEN2. The fourth enable circuit 517 may be coupled between the terminal of the first power supply voltage VH and a second common node CN2, and may form the current path of the second amplification circuit 512 and/or the second common node CN2 based on the second sub enable signal SEN2. The fourth enable circuit 517 may form the current path through the fourth enable circuit 517 to the second amplification circuit 512 and/or the second common node CN2, based on the second sub enable signal SEN2.

The second input circuit 522 of the first amplification circuit 511 and the fourth input circuit 524 of the second amplification circuit 512 may receive various reference signals. For example, the second input circuit 522 and the fourth input circuit 524 may be configured to receive a reference signal REF, similarly to the amplifier 210 illustrated in FIG. 2, and the receiving circuit 500 may further include the reference signal control circuit 240 illustrated in FIG. 2. Also, the second input circuit 522 may receive the first reference signal REF1 illustrated in FIG. 3, and the fourth input circuit 524 may receive the second reference signal REF2 illustrated in FIG. 3. The receiving circuit 500 may further include the reference signal control circuit 340 illustrated in FIG. 3.

The first enable circuit 514 may include a first transistor T55. The first transistor T55 may be, for example, a P-channel MOS transistor. The first transistor T55 may have a gate which receives a first enable signal EN1, a source which is coupled with the terminal of the first power supply voltage VH and a drain which is coupled with the first common node CN1. The second enable circuit 515 may include a second transistor T56. The second transistor T56 may be, for example, a P-channel MOS transistor. The second transistor T56 may have a gate which receives a second enable signal EN2, a source which is coupled with the terminal of the first power supply voltage VH and a drain which is coupled with the second common node CN2. The third enable circuit 516 may include a third transistor T57. The third transistor T57 may be, for example, a P-channel MOS transistor. The third transistor T57 may have a gate which receives the first sub enable signal SEN1, a source which is coupled with the terminal of the first power supply voltage VH and a drain which is coupled with the first common node CN1. The fourth enable circuit 517 may include a fourth transistor T58. The fourth transistor T58 may be, for example, a P-channel MOS transistor. The fourth transistor T58 may have a gate which receives the second sub enable signal SEN2, a source which is coupled with the terminal of the first power supply voltage VH and a drain which is coupled with the second common node CN2. In an embodiment, the first to fourth transistors T55, T56, T57, and T58 may be N-channel MOS transistors. In an embodiment, the first to fourth transistors T55, T56, T57, and T58 may have the same size and current drivability.

The enable control circuit 530 may receive a receiving select signal SEL and an amplification mode signal DIFF, and may generate the first enable signal EN1, the second enable signal EN2, the first sub enable signal SEN1, and the second sub enable signal SEN2. The enable control circuit 530 may further receive a buffer enable signal BEN. The enable control circuit 530 may enable at least one of the first enable signal EN1, the second enable signal EN2, the first sub enable signal SEN1, and the second sub enable signal SEN2 based on the receiving select signal SEL and the amplification mode signal DIFF when the buffer enable signal BEN is enabled. The enable control circuit 530 may operate as in the following table. The operation of the receiving circuit 500 in accordance with an embodiment will be described below with reference to FIG. 5 and the following table.

| BEN | SEL | DIFF | EN1 | EN2 | SEN1 | SEN2 |
|---|---|---|---|---|---|---|
| Enable | H | L | Enable | Disable | Enable | Disable |
| Enable | L | L | Disable | Enable | Disable | Enable |
| Enable | Don't care | H | Enable | Enable | Disable | Disable |
| Disable | Don't care | Don't care | Disable | Disable | Disable | Disable |

If the buffer enable signal BEN is enabled, the receiving circuit 500 and the amplifier 510 may be activated. When the receiving circuit 500 operates to receive the first input signal IN1, the receiving select signal SEL may have a logic high level and the amplification mode signal DIFF may have a logic low level. The enable control circuit 530 may enable the first enable signal IN1 and the first sub enable signal SEN1 and disable the second enable signal EN2 and the second sub enable signal SEN2, based on the receiving select signal SEL which has the logic high level and the amplification mode signal DIFF which has the logic low level. The first enable circuit 514 and the third enable circuit 516 may activate the first amplification circuit 511 based on the first enable signal EN1 and the first sub enable signal SEN1 which are enabled, and may form the current path of the first amplification circuit 511 and/or the first common node CN1. Therefore, the amplifier 510 may form a current path through two enable circuits, and differentially amplify the first input signal IN1 and the reference signal REF and generate output signals OUT and OUTS.

When the receiving circuit 500 operates to receive the second input signal IN2, the receiving select signal SEL may have a logic low level and the amplification mode signal DIFF may have the logic low level. The enable control circuit 530 may enable the second enable signal EN2 and the second sub enable signal SEN2 and disable the first enable signal EN1 and the first sub enable signal SEN1, based on the receiving select signal SEL which has the logic low level and the amplification mode signal DIFF which has the logic low level. The second enable circuit 515 and the fourth enable circuit 517 may activate the second amplification circuit 512 based on the second enable signal EN2 and the second sub enable signal SEN2 which are enabled, and may form the current path of the second amplification circuit 512 and/or the second common node CN2. Therefore, the amplifier 510 may form a current path through two enable circuits, and differentially amplify the second input signal IN2 and the reference signal REF and generate the output signals OUT and OUTB.

When the receiving circuit 500 operates to receive both the first and second input signals IN1 and IN2, the amplification mode signal DIFF may have a logic high level. The enable control circuit 530 may enable the first and second enable signals EN1 and EN2 and disable the first and second sub enable signals SEN1 and SEN2 based on the amplification mode signal DIFF which has the logic high level. The amplification control circuit 513 may couple the first and second common nodes CN1 and CN2 based on the amplification mode signal DIFF. The first and second enable circuits 514 and 515 may activate the first and second amplification circuits 511 and 512 based on the first and second enable signals EN1 and EN2 which are enabled. The first input circuit 521 of the first amplification circuit 511 and the third input circuit 523 of the second amplification circuit 512 may operate like one amplification circuit, and the amplifier 510 may generate the output signals OUT and OUTB by differentially amplifying the first and second input signals IN1 and IN2. The amplifier 510 may have two current paths through the first and second enable circuits 514 and 515. In this way, since the receiving circuit 500 may form the same number of current paths of the amplifier 510 regardless of an amplification mode, the amplifier 510 may perform a differential amplifying operation under the same environment. When the buffer enable signal BEN is disabled, the enable control circuit 530 may disable all of the first enable signal EN1, the second enable signal EN2, the first sub enable signal SEN1, and the second sub enable signal SEN2 regardless of the receiving select signal SEL and the amplification mode signal DIFF. Thus, the receiving circuit 500 and/or the amplifier 510 may be deactivated.

Figure 6:
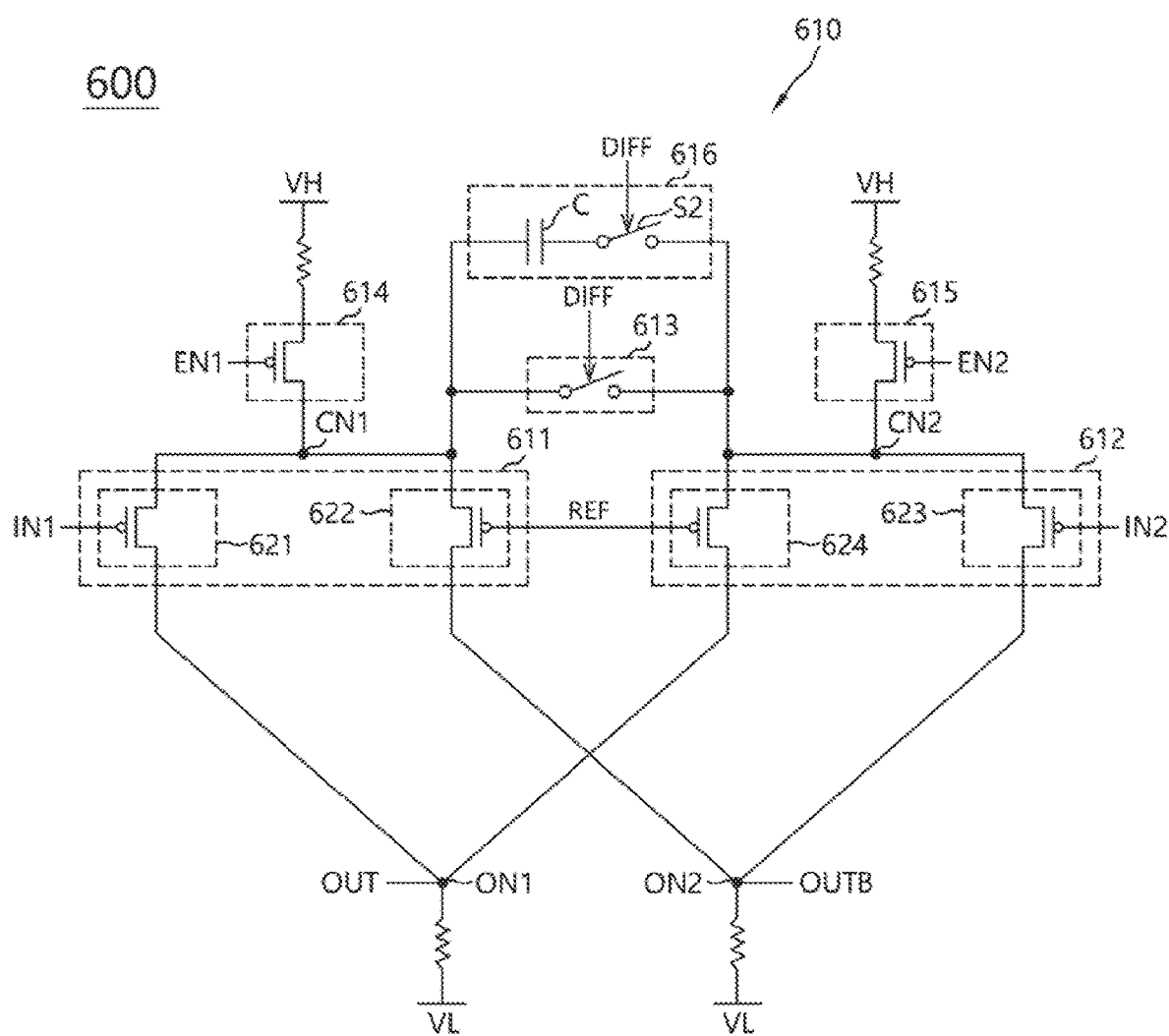
FIG. 6 is a diagram illustrating a configuration of a receiving circuit in accordance with an embodiment.

FIG. 6 is a diagram illustrating a configuration of a receiving circuit 600 in accordance with an embodiment. In FIG. 6, the receiving circuit 600 may include an amplifier 610. The amplifier 610 may include a first amplification circuit 611, a second amplification circuit 612, an amplification control circuit 613, a first enable circuit 614, and a second enable circuit 615. The first amplification circuit 611 may include a first input circuit 621 and a second input circuit 622, and the second amplification circuit 612 may include a third input circuit 623 and a fourth input circuit 624. The first amplification circuit 611, the second amplification circuit 612, the first enable circuit 614, and the second enable circuit 615 may be substantially the same as the first amplification circuit 211, the second amplification circuit 212, the first enable circuit 214, and the second enable circuit 215 of the amplifier 210 illustrated in FIG. 2, and repeated descriptions for the same components will be omitted herein. The amplifier 610 may further include a sub amplification control circuit 616. The sub amplification control circuit 616 may be coupled between a first common node CN1 and a second common node CN2. The sub amplification control circuit 616 may include a capacitor C and a switch S2 which are coupled in series between the first common node CN1 and the second common node CN2. The switch S2 may be selectively turned on based on an amplification mode signal DIFF. For example, the switch S2 may be turned on when the amplification mode signal DIFF has a logic high level. When the switch S2 is turned on, the capacitor C may be coupled between the first common node CN1 and the second common node CN2. The sub amplification control circuit 616 may improve amplification speed when the amplifier 610 differentially amplifies first and second input signals IN1 and IN2, and allows the amplifier 610 to operate as a continuous time linear equalizer (CTLE).

Figure 7:
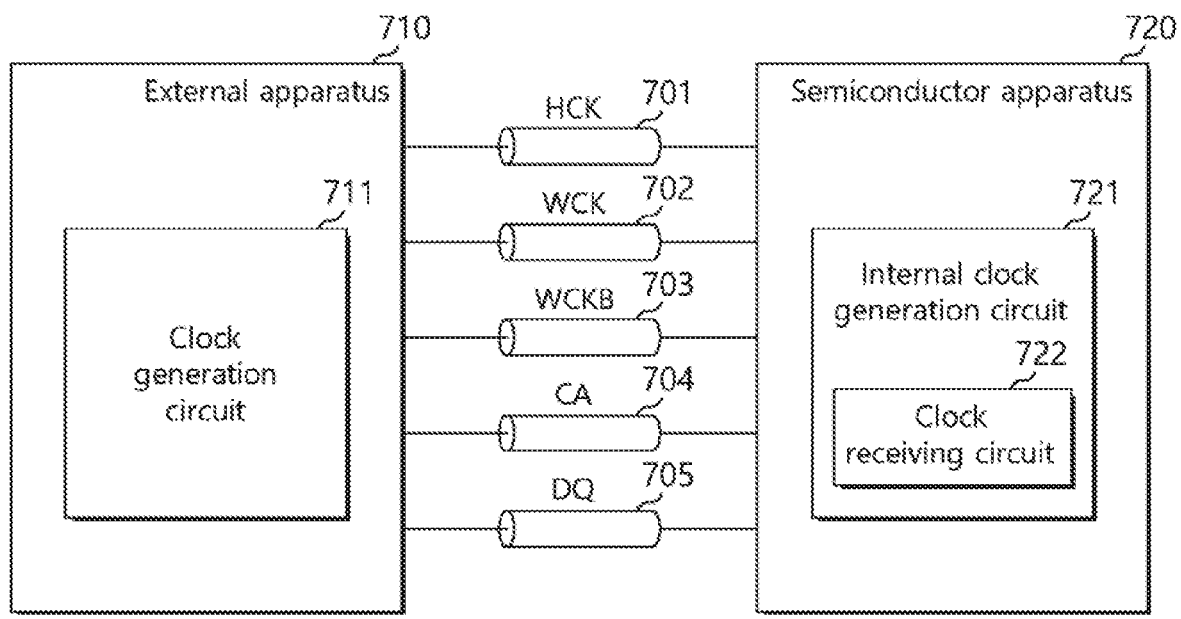
FIG. 7 is a diagram illustrating a configuration of a system in accordance with an embodiment.

FIG. 7 is a diagram illustrating a configuration of a system 7 in accordance with an embodiment. In FIG. 7, the system 7 may include an external apparatus 710 and a semiconductor apparatus 720. The external apparatus 710 may provide various control signals necessary for the semiconductor apparatus 720 to operate. The external apparatus 710 may include various kinds of electronic apparatuses or semiconductor apparatuses. For example, the external apparatus 710 may be a host apparatus such as a central processing unit (CPU), a graphics processing unit (GPU), a multimedia processor (MMP), a digital signal processor, an application processor (AP), a memory controller, etc. Also, the external apparatus 710 may be a test apparatus or test equipment for testing the semiconductor apparatus 720. In an embodiment, the semiconductor apparatus 720 may be a memory apparatus, and the memory apparatus may include a volatile memory or a nonvolatile memory. The volatile memory may include, for example, an SRAM (static RAM), a DRAM (dynamic RAM), or an SDRAM (synchronous DRAM). The nonvolatile memory may include, for example, a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM), or an FRAM (ferroelectric RAM).

The semiconductor apparatus 720 may be coupled with the external apparatus 710 which functions as a host apparatus in a first operation mode. The semiconductor apparatus 720 may be coupled with the external apparatus 710 which functions as test equipment in a second operation mode. The second operation mode may be referred to as a test operation, and the first operation mode may be referred to as all operations except the test operation. For example, after the semiconductor apparatus 720 is manufactured, the semiconductor apparatus 720 may be tested by being coupled with the external apparatus 710 functioning as test equipment. After testing is completed, the semiconductor apparatus 720 may perform various operations by being coupled with the external apparatus 710 functioning as a host apparatus.

The semiconductor apparatus 720 may be coupled with the external apparatus 710 through a plurality of buses. The plurality of buses may be signal transmission paths, links, or channels for transmitting signals. In FIG. 7, the plurality of buses may include a system clock bus 701, a first data clock bus 702, a second data clock bus 703, a command address bus 704, and a data bus 705. The system clock bus 701, the first data clock bus 702, the second data clock bus 703, and the command address bus 704 may be unidirectional buses, and the data bus 705 may be a bidirectional bus. The semiconductor apparatus 720 may be coupled with the external apparatus 710 through the system clock bus 701 and receive a system clock signal HCK through the system clock bus 701. The semiconductor apparatus 720 may be coupled with the external apparatus 710 through the first and second data clock buses 702 and 703 and receive data clock signals WCK and WCKB through the first and second data clock buses 702 and 703. The data clock signals WCK and WCKB may be transmitted as a pair of differential signals. The data clock signal WCK may be transmitted through the first data clock bus 702, and the complementary data clock signal WCKB may be transmitted through the second data clock bus 703. The semiconductor apparatus 720 may be coupled with the external apparatus 710 through the command address bus 704 and receive a command address signal CA through the command address bus 704 from the external apparatus 710. The semiconductor apparatus 720 may be coupled with the external apparatus 710 through the data bus 705, and may receive data DQ from the external apparatus 710 or transmit data DQ to the external apparatus 710, through the data bus 705.

The frequency of the system clock signal HCK may be lower than the frequency of the data clock signals WCK and WCKB. For example, the data clock signals WCK and WCKB may have a frequency two or four times higher than the system clock signal HCK. In the system 7, the command address signal CA may be transmitted to the semiconductor apparatus 720 from the external apparatus 710 in synchronization with the system clock signal HCK. The data DQ may be transmitted to the semiconductor apparatus 720 from the external apparatus 710 or be transmitted to the external apparatus 710 from the semiconductor apparatus 720, in synchronization with the data clock signals WCK and WCKB. The external apparatus 710 may include a clock generation circuit 711 to generate the system clock signal HCK and the data clock signals WCK and WCKB. The clock generation circuit 711 may include an oscillator circuit, a phase-locked loop (PLL) circuit, a delay-locked loop (DLL) circuit, or the like.

Since the data clock signals WCK and WCKB have a high frequency, the semiconductor apparatus 720 may generate a plurality of internal clock signals ICLK which have a relatively low frequency, from the data clock signals WCK and WCKB, and may internally process the data DQ in synchronization with the plurality of internal clock signals ICLK. The semiconductor apparatus 720 may include an internal clock generation circuit 721 for generating the plurality of internal clock signals ICLK from the data clock signals WCK and WCKB. The internal clock generation circuit 721 may include a clock receiving circuit 722 to receive the data clock signals WCK and WCKB. Each of the receiving circuits 100, 200, 300, 500, and 600 illustrated in FIGS. 1, 2, 3, 5, and 6 may be applied as the clock receiving circuit 722.

Figure 8:
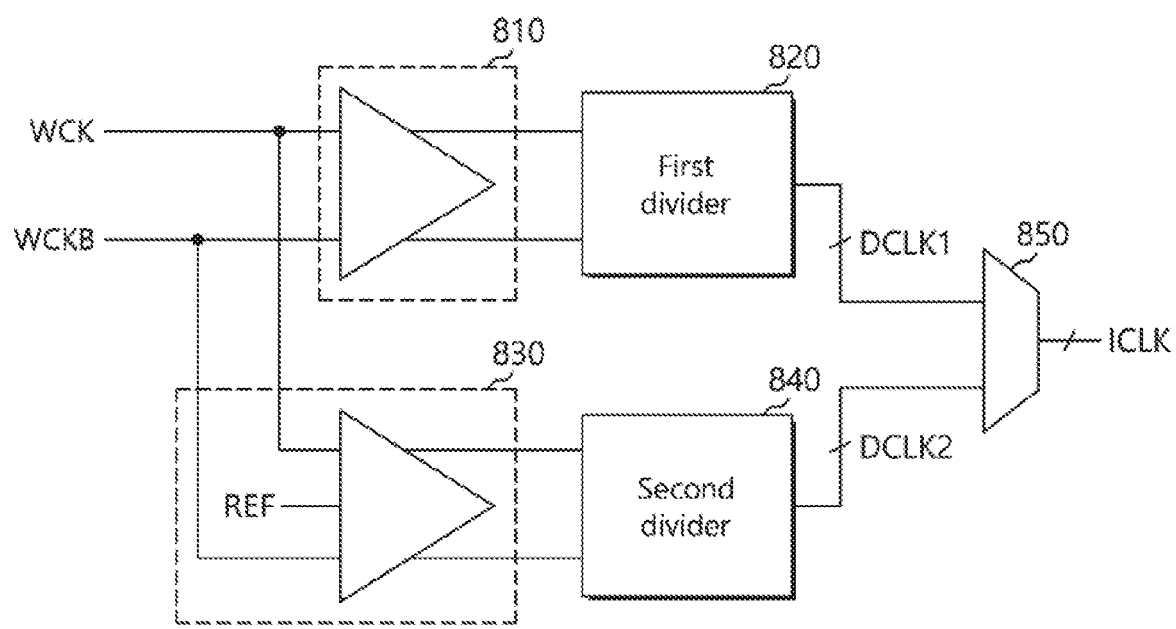
FIG. 8 is a diagram illustrating a configuration of the internal clock generation circuit illustrated in FIG. 7.

FIG. 8 is a diagram illustrating a configuration of the internal clock generation circuit 721 illustrated in FIG. 7. In FIG. 8, the internal clock generation circuit 721 may include a first clock receiving circuit 810, a first divider 820, a second clock receiving circuit 830, a second divider 840, and a clock selector 850. The first clock receiving circuit 810 may receive the data clock signal WCK and the complementary data clock signal WCKB, and may differentially amplify the data clock signal WCK and the complementary data clock signal WCKB. The semiconductor apparatus 720 may operate to activate the first clock receiving circuit 810 when the frequency of the data clock signal WCK is relatively high, such that the first clock receiving circuit 810 receives the data clock signal WCK and the complementary data clock signal WCKB by differentially amplifying the data clock signal WCK and the complementary data clock signal WCKB. The first clock receiving circuit 810 may include a CML (current mode logic) amplifier suitable for amplifying a clock signal having a high frequency. The first divider 820 may divide the output of the first clock receiving circuit 810 and generate a plurality of first divided clock signals DCLK1 which have different phases. For example, the first divider 820 may divide by four the frequency of the output of the first clock receiving circuit 810 and generate the plurality of first divided clock signals DCLK1.

The second clock receiving circuit 830 may receive at least one of the data clock signal WCK and the complementary data clock signal WCKB, and may differentially amplify at least one of the data clock signal WCK and the complementary data clock signal WCKB. The semiconductor apparatus 720 may operate such that, when the frequency of the data clock signal WCK is relatively low, the second clock receiving circuit 830 receives the data clock signal WCK and the complementary data clock signal WCKB. The second clock receiving circuit 830 may include a CMOS amplifier which is relatively slow in operating speed but is suitable for generating an accurate signal. Each of the receiving circuits 200, 300, 500, and 600 illustrated in FIGS. 2, 3, 5, and 6 may be applied as the second clock receiving circuit 830. When both the data clock signal WCK and the complementary data clock signal WCKB are transmitted from the external apparatus 710, the second clock receiving circuit 830 may differentially amplify the data clock signal WCK and the complementary data clock signal WCKB. When any one of the data dock signal WCK and the complementary data clock signal WCKB is transmitted from the external apparatus 710, the second clock receiving circuit 830 may differentially amplify the any one data clock signal (i.e., data clock signal WCK or complementary data clock signal WCKB) and a reference signal REF. In the conventional art, a CMOS amplifier for differentially amplifying the data clock signal WCK and the complementary data clock signal WCKB having a relatively low frequency, an amplifier for differentially amplifying the data clock signal WCK and a reference voltage, and an amplifier for differentially amplifying the complementary data clock signal WCKB and the reference voltage should be separately provided. However, as the second clock receiving circuit 830 adopts one of the receiving circuits 200, 300, 500, and 600 illustrated in FIGS. 2, 3, 5 and 6, only one amplifier may be provided to perform various amplifying operations. Therefore, while significantly reducing circuit area and miniaturizing a semiconductor apparatus, various amplifying operations may be performed and the data clock signals WCK and WCKB may be accurately received.

The second divider 840 may divide the output of the second clock receiving circuit 830 and generate a plurality of second divided clock signals DCLK2 which have different phases. For example, the second divider 840 may divide by two the frequency of the output of the second clock receiving circuit 830 and generate the plurality of second divided clock signals DCLK2. In an embodiment, the plurality of second divided clock signals DCLK2 may have the same frequency as the plurality of first divided dock signals DCLK1.

The clock selector 850 may receive the plurality of first divided clock signals DCLK1 and the plurality of second divided clock signals DCLK2, and may generate the internal clock signals ICLK from one of the plurality of first divided clock signals DCLK1 and the plurality of second divided clock signals DCLK2. When the first clock receiving circuit 810 operates to receive the data clock signals WCK and WCKB, the clock selector 850 may output the plurality of first divided clock signals DCLK1 as the internal clock signals ICLK. When the second clock receiving circuit 830 operates to receive the data clock signals WCK and WCKB, the clock selector 850 may output the plurality of second divided clock signals DCLK2 as the internal clock signals ICLK.

While various embodiments have been described above, it is will be understood to those skilled in the art that the described embodiments are examples only. Accordingly, the amplifier, and the receiving circuit, the semiconductor apparatus, and the semiconductor system using the amplifier described herein should not be limited based on the described embodiments.

What is claimed is:

1. A receiving circuit including an amplifier comprising:
   a first amplification circuit configured to differentially amplify an input signal and a reference voltage and configured to generate output signals;
   a second amplification circuit configured to differentially amplify a complementary input signal and the reference voltage and configured to generate the output signals;
   a first enable circuit configured to activate the first amplification circuit based on a first enable signal; and
   a second enable circuit configured to activate the second amplification circuit based on a second enable signal.

2. The receiving circuit according to claim 1, wherein the first amplification circuit comprises:
   a first input circuit configured to change a voltage level of a first output node based on the input signal; and
   a second input circuit configured to change a voltage level of a second output node based on the reference voltage, and
   wherein the output signals are generated from the first output node and the second output node.

3. The receiving circuit according to claim 2, wherein the second amplification circuit comprises:
   a third input circuit configured to change a voltage level of the second output node based on the complementary input signal; and
   a fourth input circuit configured to change a voltage level of the first output node based on the reference voltage.

4. The receiving circuit according to claim 1, further comprising:
   an enable control circuit configured to generate the first enable signal and the second enable signal based on a receiving select signal.

5. A receiving circuit including an amplifier comprising:
   a first amplification circuit coupled between a first common node and first and second output nodes and configured to change voltage levels of the first and second output nodes based on a first input signal and a reference signal;
   a second amplification circuit coupled between a second common node and the first and second output nodes and configured to change voltage levels of the first and second output nodes based on a second input signal and the reference signal; and
   an amplification control circuit configured to selectively couple the first common node and the second common node based on an amplification mode.

6. The receiving circuit according to claim 5, wherein the first amplification circuit comprises:
   a first input circuit coupled between the first common node and the first output node, and configured to change a voltage level of the first output node based on the first input signal; and
   a second input circuit coupled between the first common node and the second output node, and configured to change a voltage level of the second output node based on the reference signal.

7. The receiving circuit according to claim 6, wherein the second amplification circuit comprises:
   a third input circuit coupled between the second common node and the second output node, and configured to change the voltage level of the second output node based on the second input signal; and a fourth input circuit coupled between the second common node and the first output node, and configured to change the voltage level of the first output node based on the reference signal.

8. The receiving circuit according to claim 5,
wherein the amplification control circuit electrically couples the first common node and the second common node when the receiving circuit receives both the first and second input signals, and
wherein the amplification control circuit electrically decouples the first common node and the second common node when the receiving circuit receives any one of the first and second input signals.

9. The receiving circuit according to claim 5, wherein the amplifier further comprises:
a first enable circuit configured to form a current path through the first enable circuit to the first common node based on a first enable signal; and
a second enable circuit configured to form a current path through the second enable circuit to the second common node based on a second enable signal.

10. The receiving circuit according to claim 9, further including:
an enable control circuit configured to generate the first enable signal and the second enable signal based on a receiving select signal and an amplification mode signal.

11. The receiving circuit according to claim 5,
wherein the reference signal has a level of an off voltage when the receiving circuit receives both the first and second input signals; and
wherein the reference signal has a level of a reference voltage when the receiving circuit receives any one of the first and second input signals.

12. The receiving circuit according to claim 11, further including:
a reference signal control circuit configured to output one of the off voltage and the reference voltage as the reference signal based on the amplification mode signal.

13. The receiving circuit according to claim 5, further including:
a sub amplification control circuit configured to electrically couple the first common node and the second common node based on the amplification mode, the sub amplification control circuit comprising a capacitor element.

14. A receiving circuit comprising:
an amplifier including:
a first amplification circuit coupled between a first common node and first and second output nodes and configured to change voltage levels of the first and second output nodes based on a first input signal and a reference signal, and
a second amplification circuit coupled between a second common node and the first and second output nodes and configured to change the voltage levels of the first and second output nodes based on a second input signal and the reference signal; and
a reference signal control circuit configured to generate the reference signal which has different characteristics, based on an amplification mode signal and a receiving select signal.

15. The receiving circuit according to claim 14, wherein the first amplification circuit comprises:
a first input circuit coupled between the first common node and the first output node, and configured to change the voltage level of the first output node based on the first input signal; and
a second input circuit coupled between the first common node and the second output node, and configured to change the voltage level of the second output node based on the reference signal.

16. The receiving circuit according to claim 15, wherein the second amplification circuit comprises:
a third input circuit coupled between the second common node and the second output node, and configured to change the voltage level of the second output node based on the second input signal; and
a fourth input circuit coupled between the second common node and the first output node, and configured to change the voltage level of the first output node based on the reference signal.

17. The receiving circuit according to claim 14, wherein the amplifier further includes:
an amplification control circuit configured to couple the first and second common nodes based on the amplification mode signal.

18. The receiving circuit according to claim 17, wherein the amplifier further includes:
a sub amplification control circuit configured to couple the first and second common nodes based on the amplification mode signal, the sub amplification control circuit comprising a capacitor.

19. The receiving circuit according to claim 14,
wherein, based on the amplification mode signal, the reference signal control circuit provides an off voltage as the reference signal when the receiving circuit receives both the first and second input signals; and
wherein, based on the amplification mode signal, the reference signal control circuit provides a reference voltage as the reference signal when the receiving circuit receives any one of the first and second input signals.

20. The receiving circuit according to claim 14,
wherein the reference signal comprises a first reference signal which is inputted to the first amplification circuit and a second reference signal which is inputted to the second amplification circuit;
wherein the reference signal control circuit provides one of an off voltage, a reference voltage, and the first input signal as the first reference signal based on the amplification mode signal and the receiving select signal; and
wherein the reference signal control circuit provides one of the off voltage, the reference voltage, and the second input signal as the second reference signal based on the amplification mode signal and the receiving select signal.

21. The receiving circuit according to claim 20, wherein the reference signal control circuit comprises:
a first signal selector configured to provide one of the off voltage, the reference voltage, and the first input signal as the first reference signal based on the amplification mode signal and the receiving select signal; and
a second signal selector configured to provide one of the off voltage, the reference voltage, and the second input signal as the second reference signal based on the amplification mode signal and the receiving select signal.

22. The receiving circuit according to claim 20,
wherein, based on the amplification mode signal and the receiving select signal, the first and second reference signals both have a level of the off voltage when the receiving circuit operates to receive both the first and second input signals;

wherein, based on the amplification mode signal and the receiving select signal, the first reference signal has a level of the reference voltage and the second reference signal has a level of the second input signal when the receiving circuit operates to receive the first input signal; and wherein, based on the amplification mode signal and the receiving select signal, the first reference signal has a level of the first input signal and the second reference signal has the level of the reference voltage when the receiving circuit operates to receive the second input signal.

23. The receiving circuit according to claim 14, wherein the amplifier further includes:

a first enable circuit configured to form a current path through the first enable circuit to the first common node based on a first enable signal; and a second enable circuit configured to form a current path through the second enable circuit to the second common node based on a second enable signal.

24. The receiving circuit according to claim 23, further comprising:

an enable control circuit configured to generate the first and second enable signals based on the amplification mode signal and the receiving select signal.

25. The receiving circuit according to claim 24, wherein the amplifier further includes:

a third enable circuit configured to form a current path through the third enable circuit to the first common node based on a first sub enable signal; and a fourth enable circuit configured to form a current path through the fourth enable circuit to the second common node based on a second sub enable signal.

26. The receiving circuit according to claim 25, wherein the enable control circuit further generates the first and second sub enable signals based on the amplification mode signal and the receiving select signal.

27. The receiving circuit according to claim 1, wherein the first amplification circuit comprises a first transistor receiving the input signal and a second transistor receiving the reference voltage and the second amplification circuit comprises a third transistor receiving the complementary input signal and a fourth transistor receiving the reference voltage, wherein the first and second transistors are the same type of transistors with the third and fourth transistors.

* * * * *